United States Patent [19]

Dubertret et al.

[11] Patent Number: 4,687,269
[45] Date of Patent: Aug. 18, 1987

[54] ELECTRIC CONTACT TERMINAL THERMO-INSERTABLE ONTO A PRINTED CIRCUIT CARD AND A CONNECTOR HAVING SUCH TERMINALS

[75] Inventors: Alain Dubertret, Sevres; Gilles Rizzo, Creteil; Raymond Bargain, Sartrouville; Michel De Mendez, Montlhery; Jacky Thenaisie, Le Mans, all of France

[73] Assignee: Souriau & Cie, Boulgone Billancourt, France

[21] Appl. No.: 839,095

[22] Filed: Mar. 13, 1986

[30] Foreign Application Priority Data

Mar. 19, 1985 [FR] France ................................. 85 04042
Oct. 28, 1985 [FR] France ................................. 85 15973

[51] Int. Cl.⁴ ............................................. H01R 13/20
[52] U.S. Cl. .................................... 439/161; 439/82; 439/932
[58] Field of Search ............... 339/30, DIG. 1, 258 R, 339/259 R, 262 R, 17 LC, 17 C

[56] References Cited

U.S. PATENT DOCUMENTS 3,906,623 9/1975 Clabburn et al. ..................... 29/628
3,985,950 10/1976 Maltz ................................. 174/88 C
4,487,465 12/1984 Cherian ................................. 339/30

FOREIGN PATENT DOCUMENTS 0081372 6/1983 European Pat. Off. .
0123376 6/1984 European Pat. Off. .
0112618 7/1984 European Pat. Off. .
1327441 8/1973 United Kingdom .
1579734 11/1980 United Kingdom .
2128039A 4/1984 United Kingdom .

OTHER PUBLICATIONS

Ecker et al; "Expandable Pin for Circuit Board", Sep. 1970, IBM Dis. Bulletin, vol. 13, No. 4, p. 1016.
French Search Report FR 85 04 041.
French Search Report FR 85 04 040.
"Shape Memory Effect, Superleasticity and Damping in Cu-Zn-Al Alloys" Report 78R1, Katholieke Universiteit Leuven, Belgium, by L. Delaey, et al, Feb. 1, 1978.
French Search Report FR 85 04 042.
French Search Report FR 85 11 088.
IEEE Transactions on Components, Hybrids and Manufacturing Technology, vol. CHMT-3, Jun. 1980, pp. 226-232, IEEE, New York, U.S.
C. J. Evans, "Connector Finishes, Tin in Place of Gold", p. 226.

*Primary Examiner*—Gil Weidenfeld
*Assistant Examiner*—Paula A. Austin
*Attorney, Agent, or Firm*—Stevens, Davis, Miller & Mosher

[57] ABSTRACT

The invention relates to a connector thermo-insertable onto a printed circuit card.

Contact terminals of the connector have at least one insertable part of a shape-memory material. The insertable part of each of the terminals is shaped to the dimensions of its final use shape after insertion corresponding to its stable shape-memory state, in a manner to ensure mechanical retention and electric contact with the corresponding aperture in the printed circuit. The same insertable part is able to occupy a second memorized or not shape state, in a manner to be able to be introduced and/or withdrawn from its corresponding aperture.

Application to connectors for printed circuits in any field of use.

Figure 4:
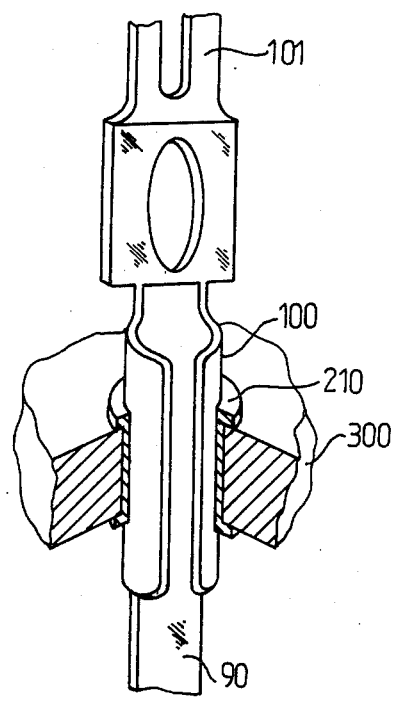

36 Claims, 11 Drawing Figures 4,687,269

ELECTRIC CONTACT TERMINAL THERMO-INSERTABLE ONTO A PRINTED CIRCUIT CARD AND A CONNECTOR HAVING SUCH TERMINALS

BACKGROUND OF THE INVENTION

The present invention relates to an electric contact terminal thermo-insertable onto a printed circuit card and to a connector having such terminals.

Electric connectors insertable by force onto a printed circuit card presently known comprise a connector body having a plurality of male or female contact terminals fixed to the body of the connector. Each contact terminal is extended at the base of the body of the connector by an insertable part. The assembly of corresponding parts of the contact terminals is intended to be inserted by force into corresponding metallised apertures of printed circuits in order to ensure corresponding electric contact and the mechanical retention of the assembly of the connector by terminal aperture interaction.

In this type of connector, the electric connection and the mechanical clamping are thus ensured by deformation of the contact terminal and/or of the printed circuit card at the corresponding aperture without the need for solder filling.

For this reason, the assembly of contact terminals of the connector and the printed circuit card are submitted to very significant stresses and frictions, during successive insertions and extractions of this type of connector, which bring about rapid deterioration of the metallisation of the apertures and the corresponding parts of the contact terminals.

Further, in the case of connectors having a large number of contact terminals, the insertion or extraction of these connectors necessitates the application of very significant global forces, which cannot be applied by means of known methods of insertion.

THE INVENTION

The present invention has the object of remedying the mentioned inconveniences by providing a connector thermoinsertable onto a printed circuit card for which the global force necessary for the positioning on insertion and/or extraction of the connector is practically eliminated Another object of the present invention is the provision of a connector of the mentioned type for which, as a result of the virtual elimination of the global force for positioning, the phenomenons of wear and deterioration of the connectors of the prior art and their associated printed circuits are eliminated Another object of the present invention is the provision of a connector of the mentioned type having, after positioning, an identical mechanical retention or even greater than that of prior art connectors insertable by force.

The electric connector thermo-insertable onto a printed circuit card according to the invention comprises a plurality of insertable male or female contact terminals combined together by at least one insulating support. It is remarkable in that the contact terminals have at least one insertable part of a shape-memory material. The insertable part of each of the terminals is shaped to the dimensions of its final use form after insertion, corresponding to its stable shapememory state, in a manner to ensure mechanical retention and electric contact with the corresponding aperture. The same insertable part is able to occupy a second shape state, memorised or not, in a manner to be able to be introduced into and/or withdrawn from its corresponding aperture.

The invention finds application in the same field as connectors insertable by force onto a printed circuit card for any type of printed circuit and any field of use of these.

THE DRAWINGS

Figure 1A:
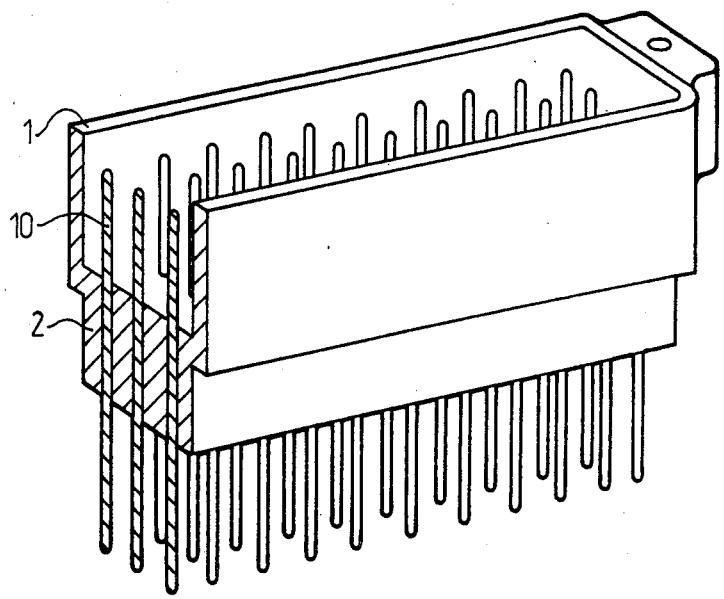
Figure 1B:
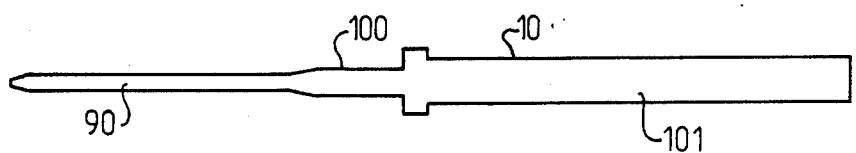
Figure 2A:
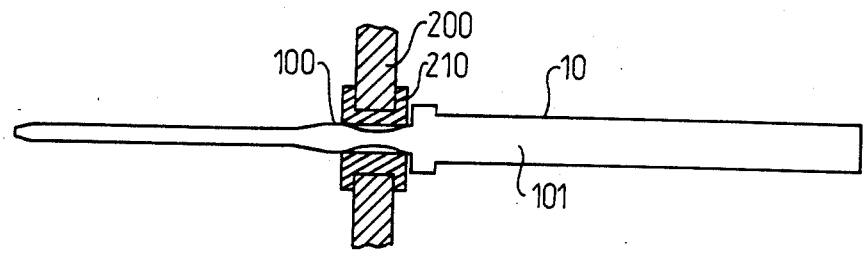
Figure 2B:
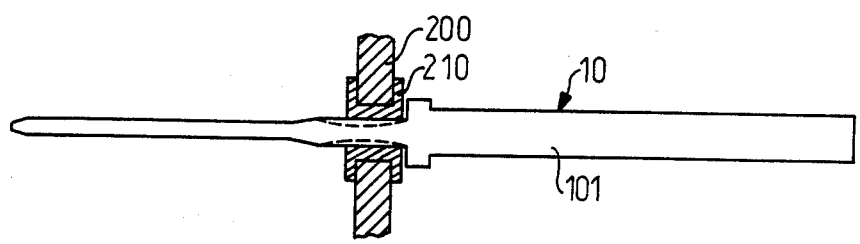
Figure 3:
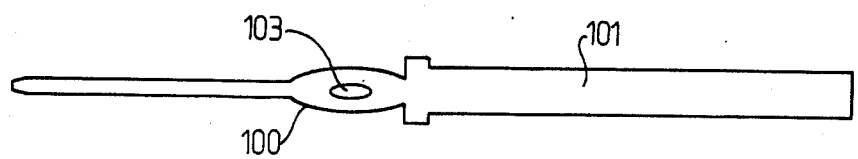
Figure 5A:
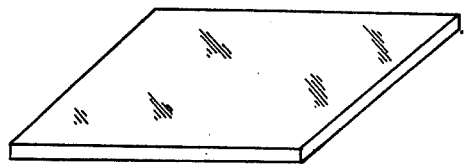
Figure 5B:
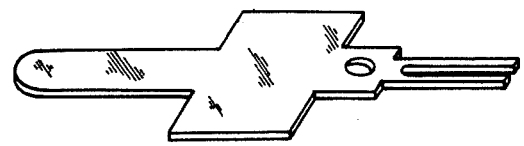
Figure 5C:
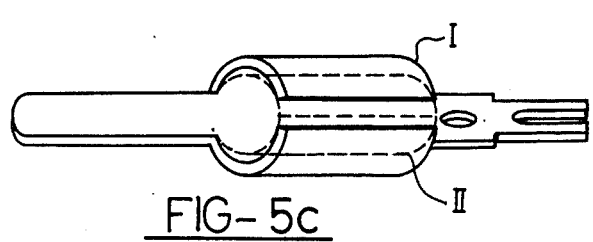
Figure 5D:
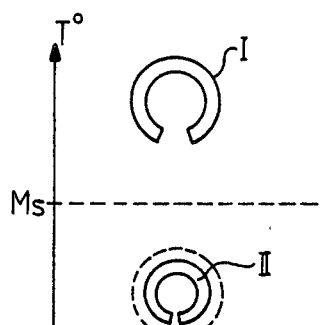
Figure 6:
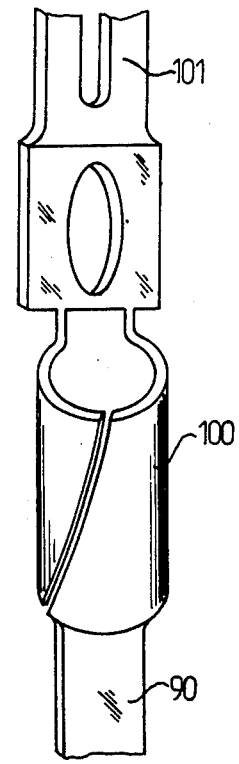

Other details and advantages of the invention will be better understood from reading the following description and studying the drawings in which:

FIG. 1 shows at 1a and 1b respectively a transverse sectional view of a connector of the invention and of a contact terminal of this connector, FIGS. 2a and 2b show advantageous embodiments of a contact terminal such as shown in FIG. 1a, FIG. 3 shows a non-limitative variant of a contact terminal able to equip the connector of the invention, FIG. 4 shows a front view of a contact terminal according to the invention, the terminal being positioned in its corresponding aperture which is shown in a broken view in order to show the structure of the contact terminal, FIGS. 5a 5b, 5c show a particularly advantageous operating method permitting the production of the contact terminal as shown in FIG. 4, FIG. 5d shows a diagram illustrative of the process called education to which the contact terminal as shown in FIG. 5c can be submitted in order to obtain, for it, two reversible shape-memory states for which the reversible passage from one state to the other can be obtained solely by changing the temperature of the insertable part or of the contact terminal, FIG. 6 shows a particular embodiment of the contact terminal of the invention.

EMBODIMENTS OF THE INVENTION

The electric connector thermo-insertable onto a printed circuit card, the object of the invention, comprises a plurality of insertable male or female contact terminals 10 combined together by at least one insulating support 2. In FIG. 1a, showing a transverse section of the connector, the contact terminals 10 are sunk in the insulating support 2 which, in a non-limitative manner, may be supposed in fact to be the shell or body of the connector 1. The contact terminals 10, as particularly shown in FIG. 1b, have at least one insertable part 100 of a conductive shape-memory material. The insertable part 100 of each of the terminals is first shaped to the dimensions of its final use shape after insertion, corresponding to a stable shape-memory state, at the use temperature of the connector. The insertable parts 100 of the male or female contact terminals 10 being engaged in the corresponding metallisation of apertures of the printed circuit card, the mentioned stable shape-memory state permits ensuring mechanical retention and electric connection with the mentioned aperture. The insertable parts 100 are further shaped in a manner to occupy, either in a non-memorised manner, or in a memorised manner, a second shape-memory state at a temperature lower than the transition temperature Ms of the material. The temperature Ms is the temperature at which the martensitic phase of the shape-memory material begins on its own to be formed. In this manner, and in the second shape state, memorised or not, the connector and the contact terminals can be introduced and/or withdrawn from the corresponding apertures, practically without noticeable force.

The memorised or non-memorised character of the second shape state of the insertable part 100 of each contact terminal 10 will be explained in a more thorough manner in connection with FIGS. 2a and 2b respectively. It must first be mentioned that the first shape-memory state is stable at ambient temperature. It must also be mentioned, that the second shape-memory state is stable at low temperature, that is to say, temperature as far as the lowest temperature provided by specifications defining the field of use of this type of connector. By way of non-limitative example, the first shape-memory state is chosen to be stable as far as temperatures of −65° C.

The second shape state when it is not memorised, is a shape state occupied by the insertable part 100, when this is brought to a temperature lower than the transition temperature Ms of the material constituting the said insertable part, under the influence of stresses exerted by the corresponding aperture on the insertable part concerned, or more precisely by the metallisation 210 of the corresponding aperture, arranged in the printed circuit board 200 as shown in FIG. 2a. As can be seen in FIG. 2a, the shape state occupied by the insertable part 100 under the influence of stresses exerted by the metallisation 210, is essentially localised at this metallisation, that is to say the contact zone between this metallisation and the insertable part 100. On withdrawal of the connector and thus of each of the 15 mentioned contact terminals 10, the second shape state is further produced successively on the other parts of the insertable part 100, brought in contact in the course of either insertion, or disconnection of the connector.

The second shape state, when on the contrary it is memorised, is produced on the entirety of each insertable part 100 of the contact terminals 10, solely by lowering of the corresponding temperature of the insertable parts, below the transition temperature Ms in the absence or presence of stresses exerted by the metallisation 210 of the apertures, as shown in FIG. 2b. Of course, the transitions from the first shape-memory state to the second shape-memory state are reversible and can be caused a significant number of times corresponding to the use of the connector.

A detailed description of a particular embodiment of the contact terminals specially adapted to provide a connector according to the invention will now be given by means of FIGS. 1b and 3. Each contact terminal 10 has a connection zone 90 able to receive a connecting electric cable. An elongate insertable part 100 is mechanically integral with the connection zone and with the male or female active contact part 101. The insertable part 100 has at least one dimension transverse to its longitudinal axis, substantially variable. For example, as shown in FIG. 1b, the insertable part 100 is substantially in the form of a blade or, as shown in FIG. 3, in the form of an oval and can be provided with one or more cutouts 103.

Of course, the entire terminal 10 can further be made of shape-memory material.

Amongst the shape-memory materials able to permit the production of the connector of the invention, the metallic compositions chosen in the group of compositions nickel-titanium, nickel-aluminium, nickel-titaniaum-iron, copper-zinc-aluminium, copper-aluminium-nickel can be used in the form of inter-metallic compositions or in alloyed form.

By way of non-limitative example, connection terminals can be made, having 4% aluminium, 28% zinc and the balance percentage of copper, in a manner to have a transition temperature in the region of −80° C. Of course, other alloys such as for example the alloys of the copper-aluminium-nickel type can be used on account of their better resistance to corrosion and ageing.

A particularly advantageous embodiment of male or female contact terminals 10 will now be given in the case where the insertable part 100 has two memorised shape-memory states. The shape-memory material being available in the form of sheets or strips, the contact terminals 10 are first obtained by conventional machining or by stamping, the said terminals and in particular the insertable part 100 of these is shaped to the final shapes and dimensions constituting the first shape-memory state, as shown for example in FIGS 1b and 3. The contact terminal 10 is then submitted to a thermal treatment able to bring it into an austenitic type crystallographic phase state. The contact terminal 10 is then submitted to a cooling to a temperature in the region of ambient temperature, for example in a non-limitative manner by means of treatment of the quenching type in order to avoid the appearance of a parasitic crystallographic phase.

The contact terminal 10 is then submitted at its insertable part 100 to a process called education.

The process of education consists of repetitively imposing on the insertable part 100, a mechanical stress such that this latter in this zone, deformed in a manner to bring the said insertable part 100 into a shape position close to the second shape-memory state and of submitting the assembly, the stress being maintained, to a lowering of temperature able to bring the insertable part 100 into a martensitic phase state. The lowering of temperature can be brought about by means of any cold source applied either to the entire contact terminal 10, or only at the insertable part 100. The mechanical stress can be applied by any means, such as a press or the like to obtain the desired shape-memory position. After removal of the mechanical stress, the contact terminal 10 is submitted to a progressive reheating to ambient temperature. The contact terminal 10 then takes up its stable shape state or the first shape-memory state. The repetition of the cycle imposed for the education as defined above, must be sufficient to obtain a good degree of reproducability of transitions between the first and second shape-memory states following the mere lowering of the temperature of the male or female contact terminal 10 to a temperature lower than the transition temperature Ms, then a successive elevation of the temperature of the contact terminal 10 to a temperature greater than the temperature Af for the return to an initial shape-memory position or stage in the austenitic state. The control of the temperature of the connector of the invention can be obtained from any source of cold normally available in an industrial environment and in particular by means of liquid nitrogen.

Of course, the mentioned process of education and of functioning of the contact terminals 10 inserted in the metallised apertures can be diverse and varied. Thus, it is possible to produce connections, being established by cooling or by heating of the corresponding contact terminals, which use the change of shape caused by the variations of temperature, or which work in the deformation conditions of the insertable parts such as superelastic conditions, for T°>Ms, or in the rubbery condition for T°<Mf (Mf being the temperature at which the entire alloy is in a martensitic phase), or in the intermediary condition by a combination of the previous effects, that is to say in fact for Ms<T°<Mf.

A variant of the process of education will be given by way of non-limitative example in connection with FIG. 2b.

According to this variant, the process consists of imposing, in the absence of deformation of the object constituted by the contact terminal 10, shaped in its initial state, a thermal stress consisting in a variation of temperature able to bring the contact terminal 10, or at least the insertable part 100 of it, into a martensitic crystallographic phase. Then, the insertable part 100 being in the mentioned state, a mechanical stress, such that the insertable part 100 is deformed, is applied in a manner to bring the insertable part 100 into a position or state close to the second shape-memory state II. The lowering of temperature and the application of the mechanical stress can be carried out with the aid of means already mentioned, the application of the mechanical stress being able to be carried out in the nitrogen bath when the cold source is constituted by such a bath. Then an intermediary shape state, close to the initial shape state of the insertable part 100, is subsequently defined and imposed on it. The imposition of the intermediary shape state to the insertable part 100 is carried out by imposition of limits of subsequent change of state of this to corresponding limits of the intermediary shape state. By intermediary shape state close to the initial shape state, is intended a shape state in which the return to the initial state has been obtained or to a shape close to this latter. The definition and imposition of limits of change of shape of the insertable part 100 can be carried out by a matrix enclosing the insertable part 100, the matrix having internal dimensions corresponding to the dimensions of the intermediary shape state. The insertable part 100 in martensitic state to which the limits of change of shape have been imposed is then submitted to a progressive reheating to the ambient temperature for returning it into an austenitic crystallographic type phase. As a result of the reheating and the holding of the insertable part 100 at the intermediary shape state, internal stresses permitting the definition of the intermediary shape state as the first shape-memory state I are then introduced into the insertable part 100.

In order to improve the resistance to ageing of the previously mentioned contact terminals 10, these can further be provided with a conductive protective covering which can consist of a deposit of gold, of an alloy of palladium, of silver or of tin-lead carried out in accordance with conventional methods. In the case of the last covering mentioned, this can in fact be used to increase its normal field of use, since there exists practically no problem of friction or wear, particularly in use of two memorised shape-memory states.

According to one embodiment of the invention, the insertable part of the contact terminal is substantially of cylindrical shape in a manner to constitute a sleeve open substantially on one of the generatrix lines.

Thus, each contact terminal has essentially a connection zone 90 able to receive a connecting electric cable. An insertable part 100 is mechanically fixed to the connection zone and to the male or female active contact part 101.

In accordance with a variant of the present invention, as shown particularly in FIG. 4, the insertable part 100 is substantially of cylindrical shape in order to constitute a sleeve open on one of its generatrix lines. In FIG. 4, is shown the contact terminal the object of the invention, inserted in a corresponding aperture provided with metallisation 210 of a multi-layer printed circuit designated 300.

The connection zone 90 can be constituted by a parallelepipedic element or stem of substantially rectangular cross-section.

Of course, the contact terminal according to the invention can be made either entirely, or for example at the insertable part 100, in a shape-memory material coming from for example, as already mentioned in the present description, from the group of compositions nickel-titanium, nickel-aluminium, nickel-titanium-iron, copper-zinc-aluminium, copper-aluminium-nickel in the form of inter-metallic compositions or in alloyed form.

Of course, the composition of the material given by way of example previously in the description, a composition according to which the material has 4% aluminium, 28% zinc and the balance percentage of copper, in a manner to obtain a temperature of transition in the region of −80° C. of this material, can advantageously be used. The sole variation below and/or above the temperature of the insertable part 100 or possibly of the entire contact terminal permits passage from one to the other of the memorised or not shape states.

It will in fact be understood that the type of contact terminal shown and described by means of FIG. 4 permits obtaining a system of connection in which the introduction into and/or withdrawal of the contact terminals from their corresponding apertures can be brought about with an insertion or withdrawal force which is virtually zero and practically without any wear. This embodiment is particularly well adapted for the connection of multi-layer printed circuits having metallisation 210 at the aperture or not, because of the adaption of the insertable part 100 to the aperture in the absence of localised deformation of this latter An operational method permitting obtaining a contact terminal having two memorised shape states, according to the invention, will now be described in connection with FIGS. 5a, 5b, 5c and 5d.

As shown in FIGS. 5a and 5b the contact terminal can be obtained in an advantageous manner, from a metallic sheet, in a form in which the shape-memory material concerned is commercially available, then by stamping in accordance with the diagram of FIG. 5b. This stamping can be carried out by any normal means. It will be noted that the stamping shown consists essentially of a longitudinal strip to which is added two substantially symmetrical lateral ears, the whole being one and the same piece.

Then, the insertable part 100 constituted by the two symmetric lateral ears is brought by rolling into its final position designated I in FIG. 5c, which constitutes the first shape-memory state as shown in FIGS. 4 and 5c. The insertable part 100 is thus constituted in a sleeve open on one of its generatrix lines.

The contact terminal as shown in FIG. 5c is then submitted to a thermal treatment able to bring it into an austenitic type crystallographic phase state then to a cooling of the quenching type, in a manner to avoid the appearance of the parasitic crystallographic phase, as already described in the present description. The contact terminal is then submitted at its insertable part 100 to a process of education, which will be described in connection with FIG. 5d.

The process of education consists of imposing repetitively on the insertable part 100, a mechanical stress, such that this latter is in this zone deformed in a manner to bring the insertable part 100 into a shape position close to the second memorised shape state and of submitting the whole, with the stress being maintained, to a lowering of temperature able to bring the insertable part 100 into a martensitic phase state. In FIG. 5d can be seen that the second memorised shape position corresponds substantially in fact to the closing of the sleeve, in such manner that the cross section of the insertable part 100, in this position, is much less than the corresponding cross-section of the same insertable part in the memorised shape position I, which, shown in dashed lines, corresponds substantially to that of the aperture or of its metallisation.

After removal of the mechanical stress, the contact terminal is submitted to a progressive reheating to ambient temperature; it then retakes up its stable shape state or first shape-memory state. The repetition of the cycle imposed for the education such as defined above, permits obtaining reversible shape-memory states I and II. The passage from one to the other shape state, can then be obtained, after education, by simple variation of the temperature of the insertable part 100 or the contact terminal as already described.

Of course, the contact terminal the object of the invention can also be produced in the absence of the process of education as previously defined, the passage from the memorised shape state I, to the non-memorised shape state II, being able to be obtained by lowering of the temperature of the insertable part 100 below the temperature of transition, under the effect of mechanical stresses exerted by the aperture or the metallisation of it on the insertable part 100, the return to the initial shape state designated I, this being memorised, being carried out by the return to ambient temperature.

Of course, variants of the insertable part 100 can be provided, without departing from the scope of the invention. Thus, by way of non-limitative example, the insertable part 100 constituting an open sleeve, can comprise at the opening on a generatrix line, an opening sloping towards at least one of the ends of it, in a manner to permit free movement of the ears constituting the lateral walls of the split sleeve, by simple modification of the temperature of it, below or above the transition temperature of the shape-memory material of it.

Preferably, in the central part of the sleeve, the edges of the slit or opening are substantially parallel. According to a particularly advantageous embodiment of the contact terminal as shown in FIG. 6, the insertable part 100 is constituted by a sleeve open on a line which is angled with respect to one of its generatrices. This embodiment has the advantage of permitting a greater tolerance or variation of the edges of the sleeve or of the aperture.

The sleeve thus formed can also be obtained from appropriate stamping, followed by rolling. Of course the mentioned embodiments are not limitative. In particular, the terminals such as the contact terminals of the present patent application can be constituted in totality or in part in a shape-memory material. In particular, only the insertable part can be constituted in a shape-memory material, the contact zone being constituted by a metallic part connected by brazing, soldering, or crimping for example.

The production of the electric connector, according to the invention, can be carried out as previously described in the description, one at least of the contact terminals being constituted by the contact terminal described in the present application.

We claim:

1. In an electric connector thermo-insertable onto a printed circuit card provided with metallised apertures comprising a plurality of insertable male or female contact terminals combined together by at least one insulating support, the improvement wherein:

said contact terminals have at least one insertable part, of shape-memory material, said insertable part of each of said terminals being shaped, on the one hand, to final shape dimensions of use after insertion, corresponding to its stable shape-memory state, in a manner to ensure mechanical retention and electric contact with said aperture, and, on the other hand, in a manner to occupy, under the influence of stresses exerted by said corresponding aperture a second non-memorised shape state at temperature lower than the transition temperature Ms of said material in a manner to be able to be introduced and/or withdrawn from said aperture.

2. An electric connector according to claim 1, wherein said first shape-memory state is stable at ambient temperature.

3. An electric connector according to claim 1, wherein said first shape-memory state is stable at low temperature.

4. An electric connector according to claim 1, wherein said terminal is entirely of shape-memory material.

5. An electric connector according to claim 1, wherein said shape-memory material is chosen amongst the group of compositions nickel-titanium, nickel-aluminium, nickel-titanium-iron, copper-zinc-aluminium, copper-aluminium-nickel, in alloy or intermetallic composition form.

6. An electric connector according to claim 1, wherein each said contact terminal has a protective conductive covering.

7. An electric connector according to claim 1, wherein each said contact terminal comprises:

a connection zone able to receive a connecting electric cable,
   an elongate insertable part mechanically fixed to said connection zone, said insertable part having at least one substantially variable dimension transverse to its longitudinal axis.

8. An electric connector according to claim 7, wherein said insertable part is substantially in the form of a blade and has one or more cut-outs.

9. In an electric connector thermo-insertable onto a printed circuit card provided with metallised apertures comprising a plurality of insertable male or female contact terminals combined together by at least one insulating support, the improvement, wherein:

said contact terminals have at least one insertable part, of shape-memory material, said insertable part of each of said terminals being shaped, on the one hand, to the final use dimensions after insertion, corresponding substantially to a first stable shape-memory state, in a manner to ensure mechanical retention and electric contact with said aperture, and, on the other hand, in a manner to be able to be introduced and/or withdrawn from its corresponding aperture in a second stable shape-memory state of said material.

10. An electric connector according to claim 9, wherein said first shape-memory state is stable at ambient temperature.

11. An electric connector according to claim 9, wherein said first shape-memory state is stable at low temperature.

12. An electric connector according to claim 9, wherein said terminal is entirely of shape-memory material.

13. An electric connector according to claim 9, wherein said shape-memory material is chosen amongst the group of compositions nickel-titanium, nickel-aluminium, nickel-titanium-iron, copper-zinc-aluminium, copper-aluminium-nickel, in alloy or intermetallic composition form.

14. An electric connector according to claim 9, wherein each said contact terminal has a protective conductive covering.

15. An electric connector according to claim 9, wherein each said contact terminal comprises:
a connection zone able to receive a connecting electric cable,
an elongate insertable part, mechanically fixed to said connection zone, said insertable part having at least one substantially variable dimension transverse to its longitudinal axis.

16. An electric connector according to claim 15, wherein said insertable part is substantially in the form of a blade and has one or more cut-outs.

17. A contact terminal thermo-insertable, onto a printed circuit card provided with metallised apertures, wherein:
said terminal is of shape-memory material and
said terminal comprises:
a connection zone able to receive a connecting electric cable,
an elongate insertable part mechanically fixed to said connection zone, said insertable part being shaped, on the one hand to the final shape dimensions after insertion, corresponding to its stable shape-memory state, in a manner to ensure mechanical retention and electric contact with said aperture, and, on the other hand, in a manner to occupy under the influence of stresses exerted by said corresponding aperture, a second non-memorised shape state at temperature lower than the transition temperature Ms of said material in a manner to be able to be introduced and/or withdrawn from said aperture.

18. An electric contact terminal according to claim 17, wherein said terminal is constituted by a sheet of shape-memory material formed by stamping and then rolling.

19. An electric contact terminal according to claim 17, wherein said terminal is entirely or in part of shape-memory material.

20. A contact terminal according to claim 19, wherein said insertable part alone is of shape-memory material, said contact zone being of an added metallic material.

21. An electric contact terminal according to claim 19, wherein said connection zone is constituted by a substantially rectangular element of parallelepipedic cross-section.

22. A contact terminal according to claim 19, wherein said insertable part is constituted by a sleeve open along a line angled with respect to one of its generatrices.

23. An electric contact terminal according to claim 19, wherein said insertable part is substantially of cylindrical shape in a manner to constitute an open sleeve.

24. A contact terminal according to claim 23, wherein said sleeve is open along one of its generatrix lines.

25. An electric contact terminal according to claim 23, wherein said insertable part consitinuting a sleeve open along one of its generatrix lines comprises at said line an opening tapering towards at least one of its ends in a manner to permit free movement of ears constituting the lateral walls of said split sleeve by modification of the temperature of it, below or above the transition temperature of its constituent material.

26. An electric contact terminal according to claim 25, wherein in a central part of said sleeve, the edges of its slit or opening are substantially parallel.

27. A contact terminal thermo-insertable onto a printed circuit card provided with metallised apertures, wherein:
said terminal is of shape-memory material and
said terminal comprises:
a connection zone able to receive a connecting electric cable,
an elongate insertable part, mechanically fixed to said connection zone, said insertable part being shaped, on the one hand, to the dimensions of its final use shape after insertion, corresponding substantially to a first stable shape-memory state, in a manner to ensure mechanical retention and electric contact with said aperture, and, on the other hand, in a manner to be able to be introduced and/or withdrawn from the corresponding aperture in a second stable shape-memory state of the said material 28. An electric contact terminal according to claim 27, wherein said terminal is entirely or in part of shape-memory material.

29. A contact terminal according to claim 28, wherein said insertable part alone is of shape-memory material, said contact zone being of an added metallic material.

30. An electric contact terminal according to claim 28, wherein said connection zone is constituted by a substantially rectangular element of parallelepipedic cross-section.

31. An electric contact terminal according to claim 28, wherein said terminal is constituted by a sheet of shape-memory material formed by stamping and then rolling.

32. A contact terminal according to claim 28, wherein said insertable part is constituted by a sleeve open along a line angled with respect to one of its generatrices.

33. An electric contact terminal according to claim 28, wherein said insertable part is substantially of cylindrical shape in a manner to constitute an open sleeve.

34. A contact terminal according to claim 33, wherein said sleeve is open along one of its generatrix lines.

35. An electric contact terminal according to claim 33, wherein said insertable part constituting a sleeve open along one of its generatrix lines comprises at said line an opening tapering towards at least one of its ends in a manner to permit free movement of ears constituting the lateral walls of said split sleeve by modification of the temperature of it, below or above the transition temperature of its constituent material.

36. An electric contact terminal according to claim 35, wherein in a central part of said sleeve, the edges of its slit or opening are substantially parallel.

* * * * *